United States Patent
Ku

(10) Patent No.: US 8,081,021 B2
(45) Date of Patent: *Dec. 20, 2011

(54) DELAY LOCKED LOOP

(75) Inventor: Young-Jun Ku, Gyeonggi-do (KR)

(73) Assignee: Hynix Semiconductor Inc. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/840,643

(22) Filed: Jul. 21, 2010

(65) Prior Publication Data

US 2010/0283520 A1     Nov. 11, 2010

Related U.S. Application Data

(63) Continuation-in-part of application No. 11/646,105, filed on Dec. 27, 2006, now Pat. No. 7,777,542.

(30) Foreign Application Priority Data

Sep. 29, 2006    (KR) .................. 10-2006-0096451

(51) Int. Cl.
*H03L 7/06*     (2006.01)

(52) U.S. Cl. ..................... 327/158; 327/149; 327/161

(58) Field of Classification Search ................. 327/149, 327/158

See application file for complete search history.

(56) References Cited

U.S. PATENT DOCUMENTS

| | | | |
|---|---|---|---|
| 6,194,930 B1 | 2/2001 | Matsuzaki et al. | |
| 6,316,976 B1 | 11/2001 | Miller et al. | |
| 6,727,739 B2 | 4/2004 | Stubbs et al. | |
| 7,777,542 B2 * | 8/2010 | Ku | 327/158 |

FOREIGN PATENT DOCUMENTS

| | | |
|---|---|---|
| KR | 2001-0064123 | 7/2001 |
| KR | 2003-0048523 | 6/2003 |
| KR | 10-2004-0037797 | 5/2004 |
| KR | 10-2005-0097700 | 10/2005 |

* cited by examiner

*Primary Examiner* — Hai L Nguyen

(74) *Attorney, Agent, or Firm* — Blakely, Sokoloff, Taylor & Zafman

(57) ABSTRACT

A semiconductor memory device includes a delay locked loop for achieving a delay locked state by correcting a phase difference between a reference clock and an internal delayed clock and for indicating the state that a larger delay amount than a maximum delay amount of a delay line is required, or a smaller delay amount than a minimum delay amount of delay line is required. A control unit resets the delay locked loop according to the state of the delay line.

10 Claims, 8 Drawing Sheets

DELAY LOCKED LOOP

CROSS-REFERENCE TO RELATED APPLICATION

The present invention is a continuation-in-part (CIP) of application Ser. No. 11/646,105, filed Dec. 27, 2006, now U.S. Pat. No. 7,777,542 B2 issued on Aug. 17, 2010, which application claims priority of Korean patent application number 10-2006-0096451, filed on Sep. 29, 2006, which is incorporated by reference in its entirety.

BACKGROUND OF THE INVENTION

The present invention relates to a semiconductor memory device; and, more particularly, to a delay locked loop for use in a semiconductor memory device in order to compensate a clock skew.

A semiconductor memory device serves to store a data in a system which includes plural semiconductor devices. When a data processing device, e.g., a central processing unit (CPU), requires a data, the semiconductor memory device outputs a data corresponding to an address inputted by the data requiring device or stores a data received from the data requiring device into a memory cell corresponding to the address.

As an operational speed of the system is increased and a semiconductor integrating technology is developed, the semiconductor memory device is required to perform a data access operation at higher speed. For performing the data access operation at high speed, a synchronous memory device has been developed for performing the data access operation in synchronization with a system clock.

For improving the operational speed of the synchronous memory device, a double data rate (DDR) synchronous memory device has been developed for performing the data access operation in synchronization with both of a rising edge and a falling edge of the system clock.

Since the DDR synchronous memory device should input or output a data in synchronization with both of a rising edge and a falling edge of the system clock, the DDR synchronous memory device should process two data within one period of the system clock. That is, the DDR synchronous memory device should output a data or store a data at a rising edge and a falling edge of the system clock.

Particularly, the timing of outputting a data from the DDR synchronous memory device should be exactly synchronized with a rising edge or a falling edge of the system clock. For this, a data output circuit of the DDR synchronous memory device outputs a data in synchronization with a rising edge and a falling edge of the system clock.

However, the system clock inputted to a semiconductor memory device is inevitably delayed while the system clock passes through internal units of the semiconductor memory device, e.g., a clock input buffer and a transfer line for transferring a clock signal. Therefore, if the data output circuit outputs a data in synchronization with the delayed system clock, an external device receives a data which is not synchronized with a rising edge and a falling edge of the system clock.

For solving the above-mentioned problem, a semiconductor memory device includes a delay locked loop. The delay locked loop serves to compensate a delay amount generated while the system clock is transferred to the data output clock after the system clock is inputted to the semiconductor memory device.

The delay locked loop detects a delay amount generated while the system clock is transferred through the clock input buffer and the clock signal transfer line and delays the system clock corresponding to the detected delay amount to output the delayed system clock to the data output circuit. That is, by the delay locked loop, the system clock inputted to the semiconductor memory device is transferred to the data output circuit being delay-locked.

The data output circuit outputs a data in synchronization with the delay locked clock and, thus, an external device recognizes that the data is outputted in synchronization with the system clock. In an actual operation, the delay locked clock outputted from the delay locked loop is transferred to an output buffer one cycle prior to a point of time when a data should be outputted, and a data is outputted in synch with the transferred delay locked clock. Therefore, a data is outputted faster than a delay amount of the system clock generated by internal circuits of the semiconductor memory device while the system clock is transferred through the semiconductor memory device.

In this manner, a data can be outputted from a semiconductor memory device in synchronization with a rising edge and a falling edge of a system clock inputted to the semiconductor memory device. As a result, a delay locked loop serves to detect how faster a data should be outputted in order to compensate a delay amount of the system clock.

FIG. 1 is a block diagram depicting a conventional delay locked loop (DLL).

As shown, the delay locked loop includes a DLL control unit 10, a clock buffer unit 20, a clock buffer control unit 30, a first delay control unit 40A, a second delay control unit 40B, a mode generation unit 50, a phase comparison unit 60, a delay replica unit 70, a duty cycle correction (DCC) control unit 80 and an output driver 90.

The clock buffer unit 20 receives external clocks clk and clkb in order to generate a first internal clock signal clkin1, a second internal clock signal clkin2, a reference clock signal refclk and a clock control signal contclk. The buffer control unit 30 serves to control an operation of the clock buffer unit 20 according to an operation mode of the semiconductor memory device and receives control signals clkeb_com, rasidle and sapd to generate a clock buffer enable signal clkbuf_enb.

The phase comparison unit 60 compares an input clock and an output clock of the conventional delay locked loop in order to detect a phase difference between the input and the output clocks. That is, the phase comparison unit 60 compares a phase of the reference clock signal refclk and phases of feedback clock signals fbclkr and fbclkf in order to output the comparison result to the mode generation unit 50. Herein, the comparison result can be classified into three cases, i.e., a case requiring a fast mode (FM_pdout_r, FM_pdout_f), a case of a delay difference (co_r, co_f) and a case of a fine delay difference (fi_r, fi_f).

The mode generation unit 50 determines whether the conventional delay locked loop is in a locked state or the fast mode should be performed because of a large phase difference based on the comparison result in order to control the first and the second delay control units 40A and 40B.

Each delay amount of the first and the second delay control units 40A and 40B is determined by an output of the mode generation unit 50 in order to respectively delay the first and the second internal clock signals clkin1 and clkin2. The first and the second internal clock signals clkin1 and clkin2 are outputted as a rising delayed signal mixout_r and a falling delayed signal mixout_f after being delayed by the first and the second delay control units 40A and 40B respectively.

The DCC control unit 80 mixes the rising and the falling delayed signals mixout_r and mixout_f in order to generate a duty-corrected clock which has a 50% duty.

The output driver 90 receives an output of the DCC control unit 80 to generate DLL output signals irclkdll and ifclkdll.

The delay replica unit 70 models a delay amount added to the external clock before the external clock is transferred to a phase delay unit and a delay amount added to an output clock of the phase delay unit until the output clock is transferred to the outside. The delay replica unit 70 receives output signals ifbclkr and ifbclkf of the DCC unit 80 in order to delay the output signals ifbclkr and ifbclkf for the modeled delay amount, and outputs the delayed signals as the feedback clock signals fbclkr and fbclkf.

In order to reduce a power consumption or more correctly keep the delay locked state according to the operation mode of the semiconductor memory device, the DLL control unit 10 is included to control an operation of the conventional delay locked loop.

The DLL control unit 10 receives a DLL reset signal dll_resetb and a DLL disable signal dis_dll to generate a reset signal rst for controlling operations of internal blocks. The reset signal rst is inputted to the mode generation unit 50 and the DCC control unit 80.

FIG. 2 is a schematic circuit diagram showing the DLL control unit shown in FIG. 1.

As shown, the DLL control unit includes a plurality of inverters and a NAND gate for generating the reset signal rst by performing a logic operation to the DLL disable signal dis_dll for disabling the conventional delay locked loop and the DLL reset signal dll_resetb for resetting the conventional delay locked loop.

FIG. 3 is a schematic circuit diagram illustrating the output driver 90 shown in FIG. 1.

As shown, the output driver 90 includes a plurality of inverters. The output driver 90 receives the duty-corrected signals ifbclkr and ifbclkf whose duty ratio is 50:50 from the DCC control unit 80. By using one of the duty-corrected signals, i.e., ifbclkr, the output driver 90 generates a rising DLL output signal irclkdll and a falling DLL output signal ifclkdll. Herein, the unused duty-corrected signal, i.e, ifbclkf, is floated.

FIG. 4 is a schematic circuit diagram showing a first mode generator 52 included in the mode generation unit 50 shown in FIG. 1.

The first mode generator 52 shown in FIG. 4 serves to control the first delay control unit 40A. Although not shown, the mode generation unit 50 also includes a second mode generator for controlling the second delay control unit 40B.

The first mode generator 52 includes a fast mode detection unit 54 and a locked state detection unit 56 each of which includes a plurality of inverters and a flip-flop. According to the comparison result signals, i.e., FM_pdout, co_r and fi_r, of the phase comparison unit 60 and the reset signal rst outputted from the DLL control unit 10, the first mode generator 52 determines whether to operate the first delay control unit 40A at the fast mode or to inform the first delay control unit 40A of the locked state so that the delay control unit 40A no further performs the delay adjusting operation. Since an operation of the schematic circuit shown in FIG. 4 is well known to those skilled in the art, a detailed description of the operation is omitted.

FIG. 5 is a schematic circuit diagram depicting the DCC control unit 80 shown in FIG. 1.

As shown, the DCC control unit 80 includes a first mixer 82 and a second mixer 84 each of which includes a plurality of inverters controlled by a mixing activation signal.

The first mixer 82 mixes the rising delayed signal mixout_r outputted from the first delay control unit 40A with the falling delayed signal mixout_f outputted from the second delay control unit 40B in order to generate the rising duty-corrected signal ifbclkr by passing the rising delayed signal mixout_r and the falling delayed signal mixout_f respectively through a first group of inverters and a second group of inverters so that the rising duty-corrected signal ifbclkr has a 50% duty. Herein, the first group of inverters is controlled by the mixing activation signal en<0:n> and the second group of inverters is controlled by an inverted mixing activation signal enb<n:0>. The number of inverters included in the first group is same to that of the second group.

Meanwhile, the second mixer 84 receives the rising delayed signal mixout_r and the falling delayed signal mixout_f in order to correct a duty ratio of one of the received signals by passing the one of the received signals through a plurality of inverters and, then, outputs the duty-corrected signal as the falling duty-corrected signal ifbclkf.

Although not shown, the mixing activation signal en<0:n> and the inverted mixing activation signal enb<n:0> are generated by the reset signal rst outputted from the DLL control unit 10. Further, the DCC control unit 80 determines whether the duty ratio correction operation is normally performed in order to generate a DCC enable signal DCC_ENb.

The above-mentioned conventional delay locked loop includes two delay lines. When the delay locked state is broken due to external variations, e.g., an unstable power supply voltage and a distorted input clock, after the delay locking operation is completed, the delay locking operation should be performed again.

In this case, if the delay amount cannot be increased further, because all of the delay elements included in one of the delay lines are currently used for delaying an input signal, or if the delay amount cannot be decreased further, because none of the delay elements is currently used for delaying the input signal, the delay lines fail to readjust the delay amount. Accordingly, it is difficult for the DCC control unit 80 to generate a correct signal.

SUMMARY OF THE INVENTION

Embodiments of the present invention are directed to resetting a delay locked loop when a delay locking operation is needed to be performed again (due to environmental variations), and where a delay locked state cannot be achieved by using a maximum or a minimum delay amount.

In accordance with an aspect of the present invention, there is provided a semiconductor memory device, including: a delay locked loop for achieving a delay locked state by correcting a phase difference between a reference clock and an internal delayed clock and for indicating the state that a larger delay amount, larger than a maximum delay amount of a delay line, is required, or a smaller delay amount, smaller than a minimum delay amount of delay line, is required; and a control unit for resetting the delay locked loop according to the state of the delay line.

In accordance with another aspect of the present invention, there is provided a semiconductor memory device, including: a phase comparison unit for comparing a phase of a reference clock with a phase of an inverted version of the reference clock, in order to achieve a delay locked state by correcting a phase difference between the reference clock and an internal delayed clock; a first delay circuit for delaying a rising edge of the reference clock; a second delay circuit for delaying a falling edge of the reference clock; and a control unit for selectively resetting the first and the second delay circuits according to a first delay state signal and a second delay state signal respectively outputted from the first and the second delay circuits, wherein the first and the second delay state signals are activated when a larger delay amount, larger than a maximum delay amount of the first and the second delay circuits, is required, or a smaller delay amount, smaller than a minimum delay amount of the first and the second delay circuits, is required.

In accordance with a further another aspect of the present invention, there is provided a method for operating a semiconductor memory device, including the steps of: achieving a delay locked state by correcting a phase difference between a reference clock and an internal delayed clock and indicating the state that a delay amount larger than a maximum delay amount of a delay line is required, or a delay amount smaller than a minimum delay amount of delay line is required; and resetting wholly or partially a delay locked loop according to the state of the delay line.

DESCRIPTION OF SPECIFIC EMBODIMENTS

It is an object of the present invention to provide a delay locked loop for resetting a delay locked loop when a delay locking operation is needed to be performed again (due to environmental variations) and a delay locked state cannot be achieved by using a maximum or a minimum delay amount.

Hereinafter, a delay locked loop in accordance with the present invention will be described in detail referring to the accompanying drawings.

Figure 6:
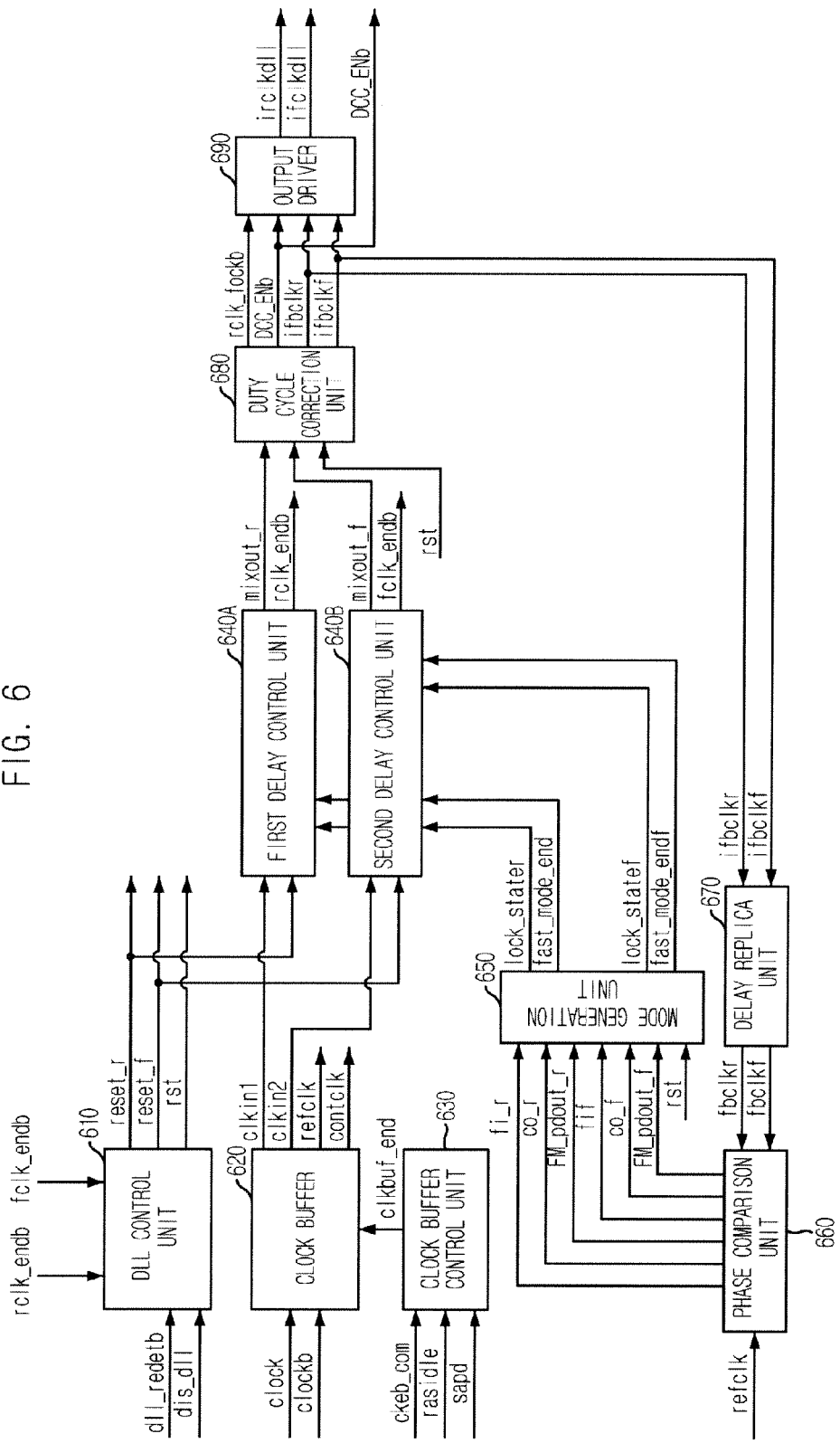
FIG. 6 is a block diagram showing a delay locked loop in accordance with a preferred embodiment of the present invention.

FIG. 6 is a block diagram showing a delay locked loop (DLL) in accordance with a preferred embodiment of the present invention.

As shown, the delay locked loop includes a DLL control unit 610, a clock buffer unit 620, a clock buffer control unit 630, a first delay control unit 640A, a second delay control unit 640B, a mode generation unit 650, a phase comparison unit 660, a delay replica unit 670, a duty correction unit 680 and an output unit 690.

The clock buffer unit 620 receives and buffers external clocks clk and clkb in order to generate a first internal clock signal clkin1, a second internal clock signal clkin2, a reference clock signal refclk and a clock control signal contclk. The buffer control unit 630 serves to control the clock buffer unit 620 according to an operation mode of a semiconductor memory device. The buffer control unit 630 receives a clock enable signal clkeb_com, a RAS operation information signal rasidle and a power down signal sapd which indicates a power down mode in order to generate a clock buffer enable signal clkbuf_enb. The clock buffer enable signal clkbuf_enb serves to disable the clock buffer unit 620 for preventing unnecessary power consumption.

The first and the second delay control units 640A and 640B respectively delay the first and the second internal clock signals clkin1 and clkin2. The first and the second internal clock signals clkin1 and clkin2 are outputted as a rising delayed signal mixout_r and a falling delayed signal mixout_f after being delayed by the first and the second delay control units 640A and 640B.

Further, the first and the second delay control units 640A and 640B output delay state signals rclk_endb and fclk_endb to the DLL control unit 610. Herein, the delay state signals rclk_endb and fclk_endb indicate that a larger delay amount than a maximum delay amount is needed or a smaller delay amount than a minimum delay amount is needed.

The delay replica unit 670 models a delay amount added to the external clock until the external clock is transferred to a phase delay unit and a delay amount added to an output clock of the phase delay unit until the output clock is transferred to the outside. The delay replica unit 670 receives output signals ifbclkr and ifbclkf of the duty correction unit 680 in order to delay the received signals for the modeled delay amount, and outputs the delayed signals as feedback clock signals fbclkr and fbclkf.

The phase comparison unit 660 compares an input clock and an output clock of the delay locked loop in order to detect a phase difference between the input and the output clocks. That is, the phase comparison unit 660 compares a phase of the reference clock signal refclk and phases of the feedback clock signals fbclkr and fbclkf in order to output the comparison result to the mode generation unit 650. Herein, the comparison result can be classified into three cases, i.e., a case requiring a fast mode (FM_pdout_r, FM_pdout_f), a case of a delay difference (co_r, co_f) and a case of a fine delay difference (fi_r, fi_f).

The mode generation unit 650 includes circuits for respectively controlling the first and the second delay control units 640A and 640B. The mode generation unit 650 determines whether the delay locked loop is in a locked state or the fast mode should be performed because of a large phase difference based on the comparison result in order to control the first and the second delay control units 640A and 640B.

When there is a large phase difference between the reference clock signal refclk and the feedback clock signal, a fast mode signal fast_mode_end is in a logic low level so that each delay amount of the first and the second delay control units 640A and 640B is large. On the contrary, when a phase difference between the reference clock signal refclk and the feedback clock signal is smaller than a predetermined value, the fast mode signal fast_mode_end is in a logic high level so that the delay amount of the first and the second delay control units 640A and 640B is decreased. Furthermore, when the phase difference between the reference clock signal refclk and the feedback clock signal is smaller than a minimum delay amount of a unit delay cell included in the first and the second delay control units 640A and 640B, a locking state signal (lock_stater, lock_statef) is changed from a logic low level to a logic high level so that the first and the second delay control units 640A and 640B performs a fine delay adjustment operation.

The duty correction unit 680 mixes the rising and the falling delayed signals mixout_r and mixout_f in order to generate duty-corrected clock signals ifbclkr and ifbclkf which have a duty ratio of 50%. Further, the duty correction unit 680 generates a rising locking signal rclk_lockb for indicating which one of outputs of the first and the second delay control units 640A and 640B is delay locked. Furthermore, the duty correction unit 680 determines whether the duty ratio correction operation is normally completed in order to generate a DCC enable signal DCC_ENb. That is, when the feedback clock signal and the reference clock signal refclk have the same phase, the duty correction unit 680 determines that the duty ratio correction operation is normally completed.

The output driver 690 generates DLL output signals irclkdll and ifclkdll based on one, which is selected by the rising locking signal rclk_lockb, of the duty-corrected signals ifbclkr and ifbclkf.

In order to reduce a power consumption or more correctly keep the delay locked state according to the operation mode of the semiconductor memory device, the DLL control unit 610 receives the delay state signals rclk_endb and fclk_endb. The DLL control unit 610 receives a DLL reset signal dll_resetb and a DLL disable signal dis_dll to generate a whole reset signal rst for controlling whole operations of internal blocks and generates partial reset signals reset_r and reset_f which correspond to the delay state signals rclk_endb and fclk_endb.

The whole reset signal rst is inputted to the mode generation unit 650 and the duty correction unit 680 for resetting the whole operation of the delay locked loop, and the partial reset signals reset_r and reset_f are inputted to the mode generation unit 650, the first delay control unit 640A and the second delay control unit 640B for resetting a partial operation of the delay locked loop.

Figure 7:
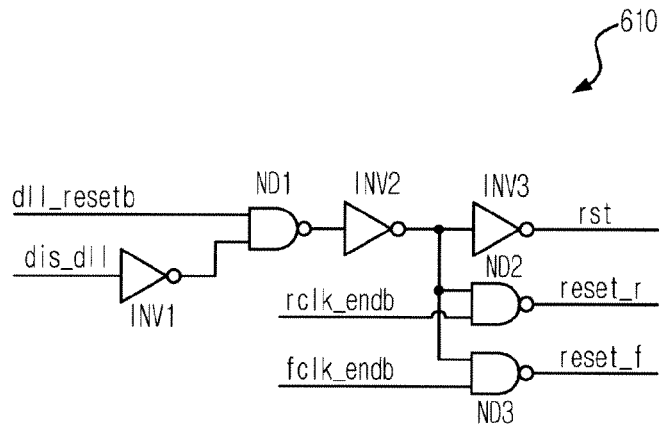
FIG. 7 is a schematic circuit diagram depicting the DLL control unit shown in FIG. 6.

FIG. 7 is a schematic circuit diagram depicting the DLL control unit 610 shown in FIG. 6.

Referring to FIG. 7, the DLL control unit 610 includes a whole reset unit for generating the whole reset signal rst in response to an externally inputted DLL reset signal dll_resetb and the DLL disable signal dis_dll; and a partial reset unit for generating the partial reset signals reset_r and reset_f in response to the delay state signals rclk_endb and fclk_endb when the whole reset signal rst is inactivated.

In detail, the whole reset unit includes a first inverter INV1 for inverting the DLL disable signal dis_dll; a first NAND gate ND1 for performing a logic NAND operation to an output of the first inverter INV1 and the DLL reset signal dll_resetb; a second inverter INV2 for inverting an output of the first NAND gate ND1; and a third inverter INV3 for inverting an output of the second inverter INV2 to output the inverted signal as the whole reset signal rst.

The partial reset unit includes a second NAND gate ND2 for performing a logic NAND operation to the output of the second inverter INV2 and the delay state signal rclk_endb; and a third NAND gate ND3 for performing a logic NAND operation to the output of the second inverter INV2 and the delay state signal fclk_endb.

Figure 8:
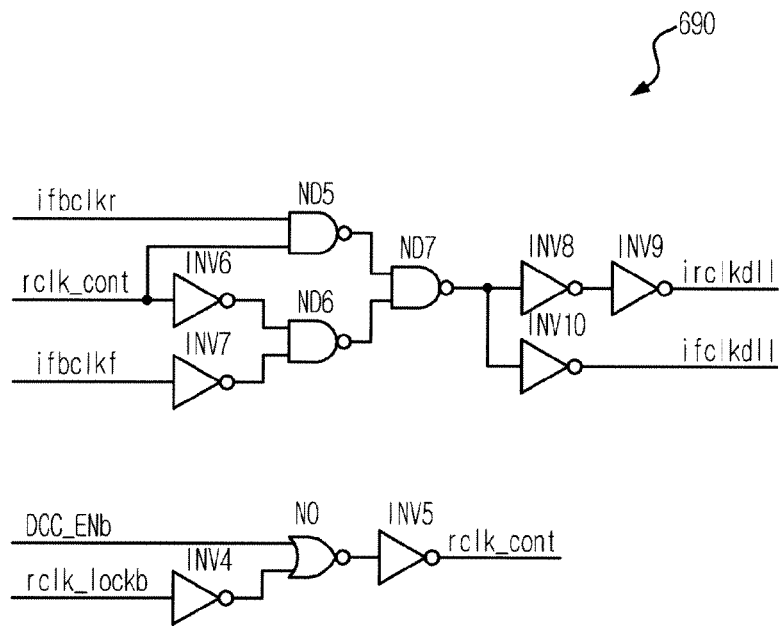
FIG. 8 is a schematic circuit diagram illustrating the output driver shown in FIG. 6.

FIG. 8 is a schematic circuit diagram illustrating the output driver 690 shown in FIG. 6.

Referring to FIG. 8, the output driver 690 selects one of the duty-corrected signals ifbclkr and ifbclkf in response to the rising locking signal rclk_lockb in order to generate the DLL output signals irclkdll and ifclkdll. Herein, the rising locking signal indicates that the first delay control unit 640A is in a delay locked state when the second delay control unit 640B is in a reset state or the second delay control unit 640B is in a delay locked state when the first delay control unit 640A is in a reset state.

In detail, the output driver 690 includes a fourth inverter INV4 for inverting the rising locking signal rclk_lockb; a NOR gate NO performing a logic NOR operation to an output of the fourth inverter INV4 and the DCC enable signal DCC_ENb; a fifth inverter INV5 for generating a selection signal rclk_cont by inverting an output of the fourth NAND gate ND4; a fifth NAND gate ND5 for performing a logic NAND operation to the duty-corrected signal ifbclkr and the selection signal rclk_cont; a sixth inverter INV6 for inverting the selection signal rclk_cont; a seventh inverter INV7 for inverting the duty-corrected signal ifbclkf; a sixth NAND gate ND6 for performing a logic NAND operation to an output of the sixth inverter INV6 and a output of the seventh inverter INV7; an eighth and a ninth inverters INV8 and INV9 connected in series for buffering an output of the seventh NAND gate ND7 to generate the DLL output signal irclkdll; and a tenth inverter INV10 for generating the DLL output signal ifclkdll by inverting the output of the seventh NAND gate ND7.

The above-described circuit is just one embodiment of the present invention. The duty-corrected signals ifbclkr and ifbclkf can be replaced with each other and an activation logic level of the rising locking signal rclk_lockb can be changed for obtaining the same result.

Figure 9:
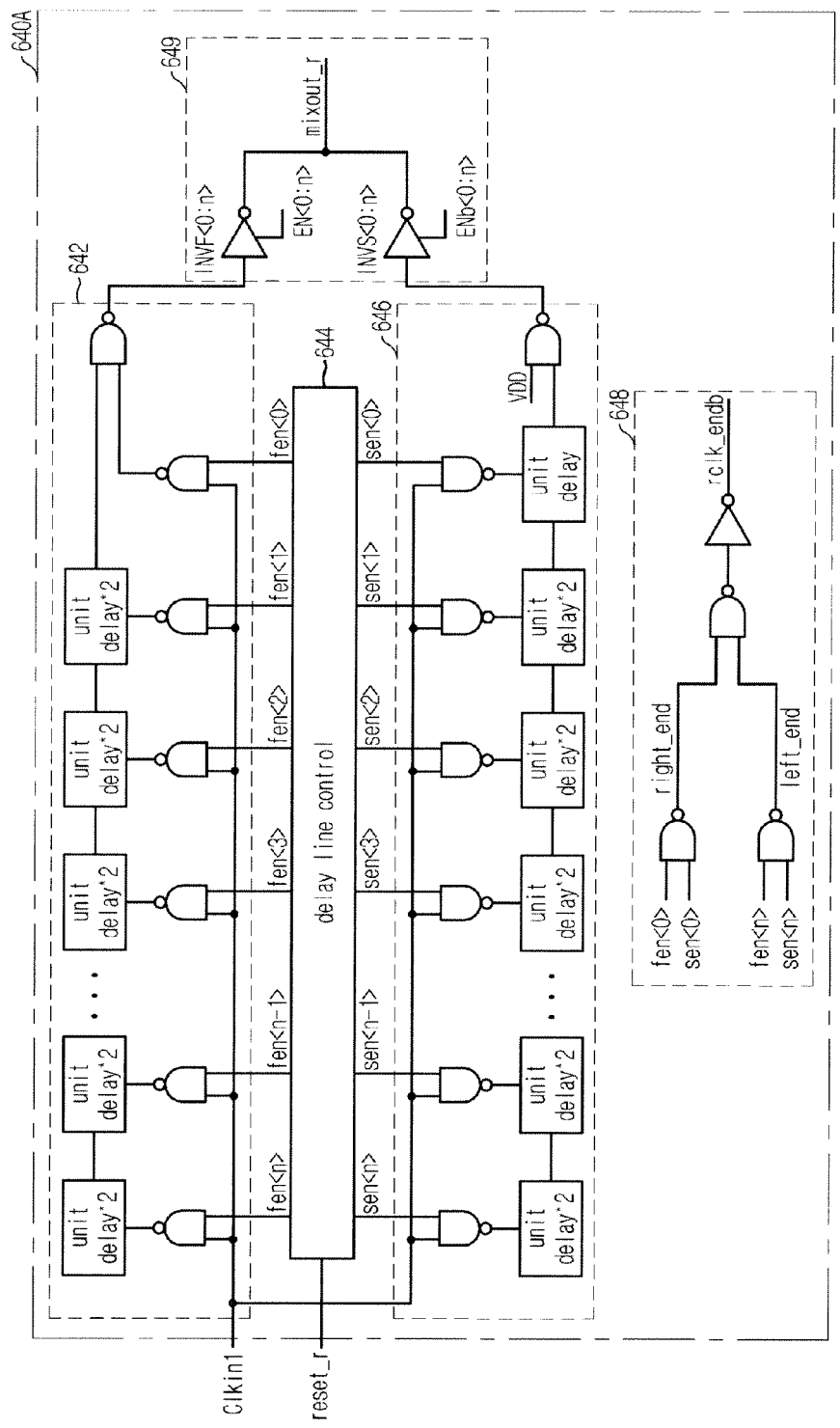
FIG. 9 is a schematic circuit diagram depicting the first delay control unit shown in FIG. 6.

FIG. 9 is a schematic circuit diagram depicting the first delay control unit 640A shown in FIG. 6.

As shown, the first delay control unit 640A includes a first delay group 642, a second delay group 646, a delay control unit 644; a state signal generation unit 648, and an output unit 649.

The delay control unit 644 generates first and second delay control signals fen<n:0> and sen<n:0> for controlling the first delay cells and the second delay cells. The first delay group 642 includes a plurality of first delay cells connected to one another for delaying an input signal for a first delay amount in response to the first delay control signals fen<n:0>. Likewise, the second delay group 646 includes a plurality of second delay cells connected in series for delaying the input signal for a second delay amount in response to the second delay control signals sen<n:0>.

The state signal generation unit 648 receives the delay control signals fen<0>, sen<0>, fen<n> and sen<n> for controlling a first and a last delay cells of the first and the second delay groups 642 and 646 in order to generate the delay state signal rclk_endb. The first bits fen<0> and sen<0> of the first and second fen<n:0> and sen<n:0> indicate the minimum delay state of the first delay control unit 640A and the final bits fen<n> and sen<n> of the first and second fen<n:0> and sen<n:0> indicate the maximum delay state of the first delay control unit 640A. By generating the delay state signal rclk_endb in response to the delay control signals fen<0>, sen<0>, fen<n> and sen<n>, the state signal generation unit 648 informs the maximum or a minimum delay state of the first delay control unit 640A to the DLL control unit 610. The DLL control unit 610 generates the partial reset signals reset_r in response to the delay state signal rclk_endb and resets the first delay control unit 640A in response to the partial reset signals reset_r.

The output unit 649 combines each output of the first and the second delay groups 642 and 646 to generate the rising delayed signal mixout_r. The output unit 649 includes a plurality of inverters INVF<0:n> and INVS<0:n> for receiving the outputs of the first and the second delay groups 642 and 646.

Since an internal structure and an operation of the first and the second delay groups 642 and 646 are well known to those skilled in the art, a detailed explanation is omitted. Herein, as shown in FIG. 9, the second delay group 646 includes a delay cell whose delay amount is half of that of another delay cell for a fine delay adjustment.

Figure 1:
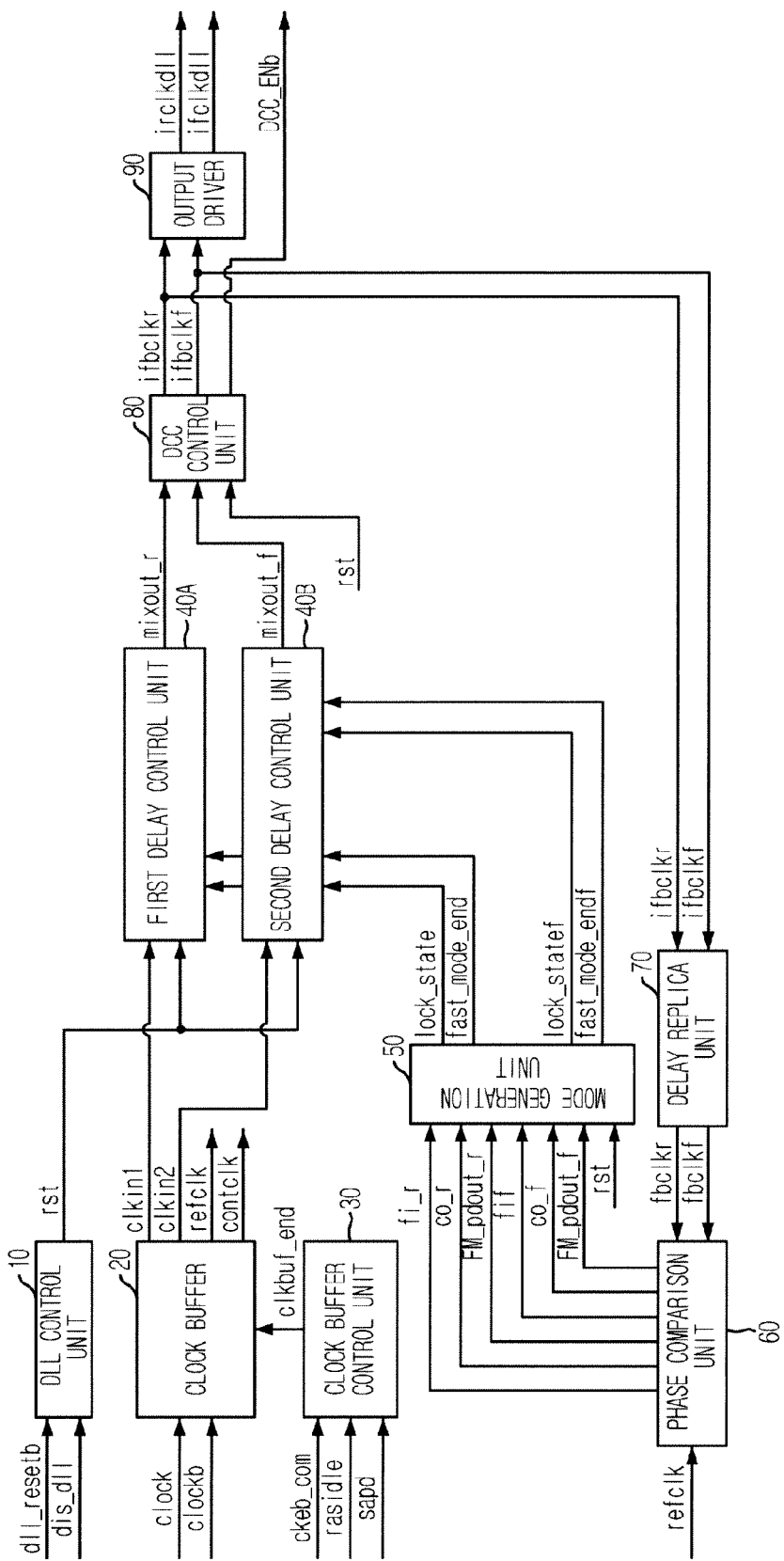
FIG. 1 is a block diagram depicting a conventional delay locked loop.
Figure 2:
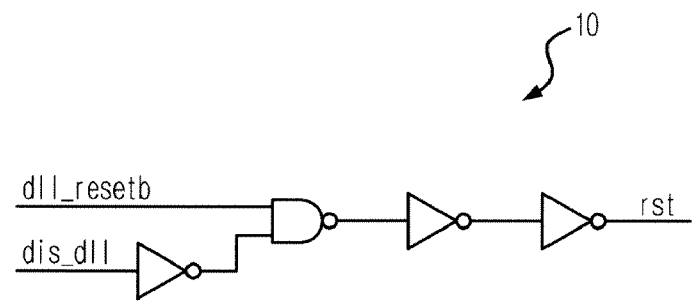
FIG. 2 is a schematic circuit diagram showing the DLL control unit shown in FIG. 1.
Figure 3:
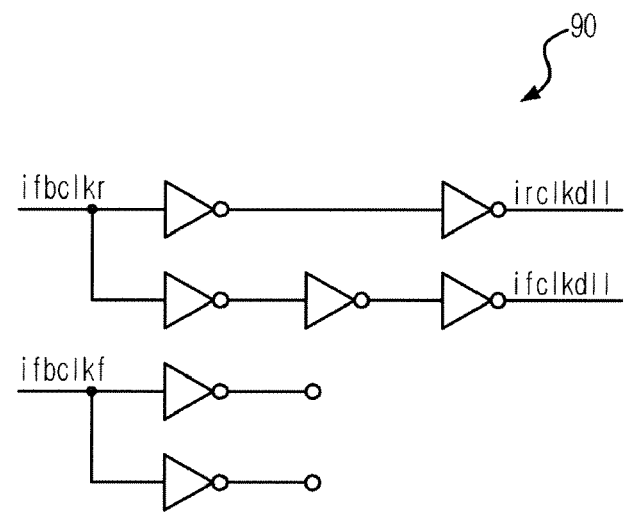
FIG. 3 is a schematic circuit diagram illustrating the output driver shown in FIG. 1.
Figure 4:
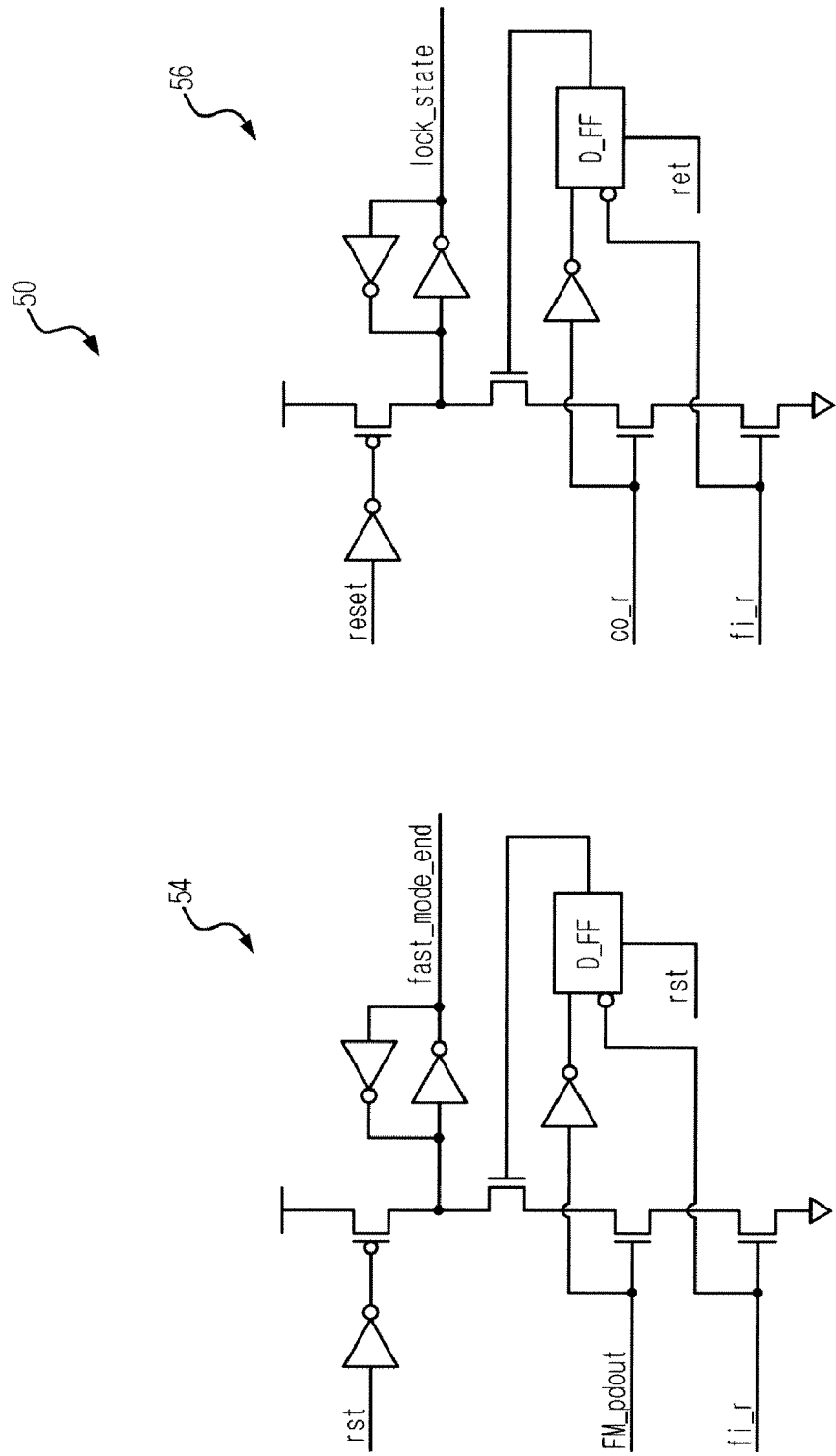
FIG. 4 is a schematic circuit diagram showing a first mode generator included in the mode generation unit shown in FIG. 1.
Figure 5:
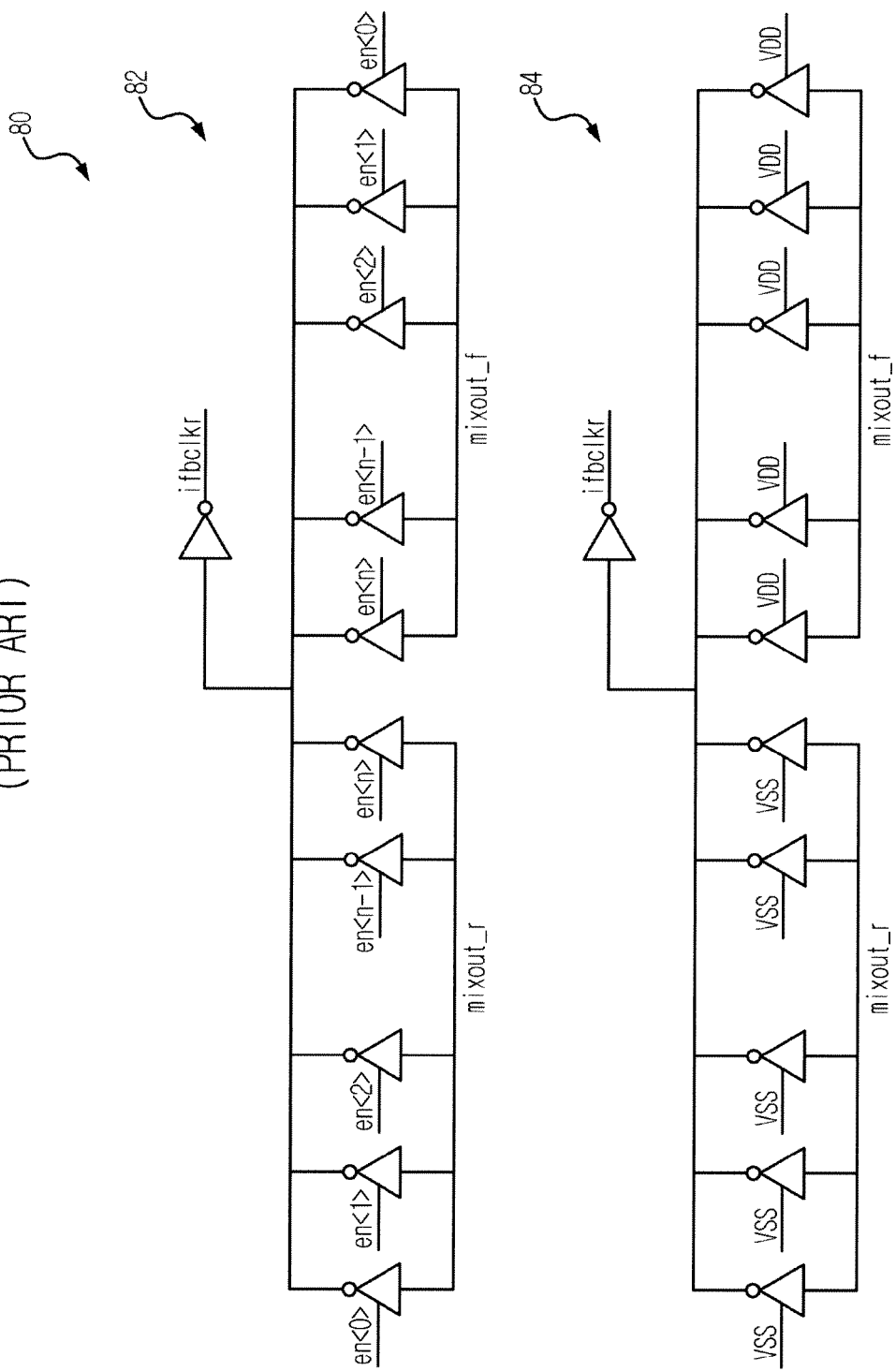
FIG. 5 is a schematic circuit diagram depicting the DCC control unit shown in FIG. 1.

Further, circuits included in the mode generation unit 650 for controlling the first and the second delay control units 640A and 640B in response to the partial reset signals reset_r and reset_f can be wholly reset, or only corresponding circuits can be reset. Since this structure can be easily designed by those skilled in the art by modifying the conventional mode generation unit shown in FIG. 4, a detailed explanation is omitted.

As above-descried referring to FIGS. 6 to 9, the delay locked loop informs the DLL control unit 610 of each delay state, i.e., a maximum or a minimum delay state, of the first and the second delay control units 640A and 640B. Base on this information, the delay locked loop can prevent a stuck state.

Figure 10:
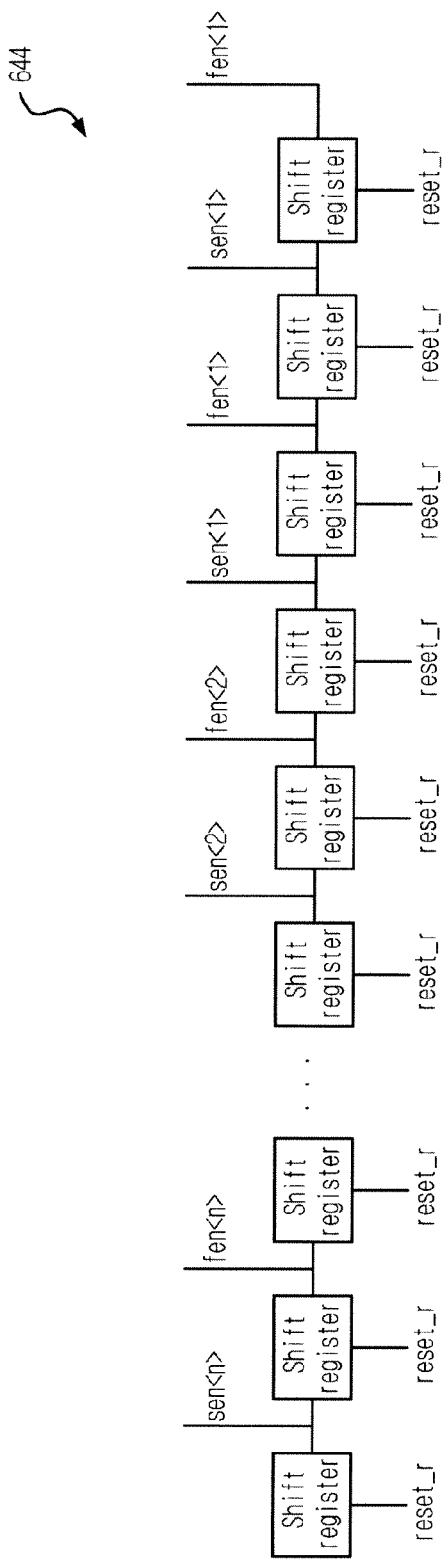
FIG. 10 is a schematic circuit diagram illustrating the delay line control shown in FIG. 9.

FIG. 10 is a schematic circuit diagram illustrating the delay line control 644 shown in FIG. 9

As shown, the delay line control 644 is configured with a plurality of shift registers serially connected one another, each of which is reset by the partial reset signals reset_r.

In accordance with the present invention, when the delay locked state is broken due to external variations, e.g., a lowered power supply voltage causing a degraded operational speed of a semiconductor device and a delay amount variation, and, thus, it is needed to finely adjust a delay amount, if a delay control unit currently delays a signal for a maximum/minimum delay amount, a corresponding part of the delay control unit is reset so that a previous delay locked state can be kept and a requiring time for setting a new delay locked state can be reduced.

Further, the output driver is informed that the other delay control unit is in a delay locked state while the delay control unit is partially reset so that a DLL output signal can be continuously generated.

Accordingly, in spite of the external variations, a delay locked state can be set again in a short time and it is possible to reduce a power consumption by resetting the delay locked loop wholly or partially according to the external variations and the operation mode of a semiconductor memory device.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
    a delay locked loop for achieving a delay locked state by correcting a phase difference between a reference clock and an internal delayed clock and for indicating the state that a larger delay amount, larger than a maximum delay amount of a delay line, is required, or a smaller delay amount, smaller than a minimum delay amount of delay line is required; and
    a control unit for resetting the delay locked loop according to the state of the delay line,
    wherein the delay locked loop includes:
        a first delay line to be operated based on a rising edge of the reference clock; and
        a second delay line to be operated based on a falling edge of the reference clock,
    wherein the control unit can reset the first delay line or the second delay line.

2. The semiconductor memory device as recited in claim 1, wherein the delay locked loop includes:
    a clock buffer for generating an internal clock and the reference clock by buffering an externally inputted clock;
    a phase detection unit for generating a plurality of phase control signals according to a phase difference between the reference clock and a feedback rising and a feedback falling clocks;
    a delay circuit unit having a delay line for delaying the internal clock in order to generate a delayed rising clock and a delayed falling clock in response to the plurality of phase control signals;
    a duty correction unit for generating a delay locked clock whose duty is corrected by using the delayed rising clock and the delayed falling clock; and
    a delay replica unit for delaying the delay locked clock and an inverted version of the delay locked clock for a modeled delay amount in order to generate the feedback rising clock and the feedback falling clock.

3. The semiconductor memory device as recited in claim 2, wherein the delay circuit unit includes:
    a mode generation unit for receiving the plurality of phase control signals in order to determine a locking state and a fast mode;
    a first delay control unit for generating the delayed rising clock by delaying the internal clock, and for generating a first state signal when a larger delay amount, larger than a maximum delay amount, is required or a smaller delay amount, smaller than a minimum delay amount, is required according to an output of the mode generation unit; and
    a second delay control unit for generating the delayed falling clock by delaying the internal clock and for generating a second state signal when a larger delay amount than a maximum delay amount is required, or a smaller delay amount than a minimum delay amount is required, according to the output of the mode generation unit.

4. The semiconductor memory device as recited in claim 3, wherein the control unit receives the first and the second state signals to generate a reset signal for resetting the mode generation unit and the duty correction unit, and to generate a rising reset signal and a falling reset signal for resetting the first and the second delay control units and an internal part of the mode generation unit, in response to an externally inputted reset command.

5. The semiconductor memory device as recited in claim 4, wherein the delay locked loop includes a buffer control unit for receiving a clock enable signal, a RAS information signal and a power down mode signal in order to control the clock buffer.

6. The semiconductor memory device as recited in claim 4, wherein the duty correction unit generates a rising locking signal for indicating which one of the first and the second delay control units is currently reset.

7. The semiconductor memory device as recited in claim 6, wherein the delay locked loop includes a signal output driver for selecting one of a first duty-corrected signal and a second duty-corrected signal outputted from the duty correction unit in order to output the selected signal as a delay locked loop output signal in response to the rising locking signal.

8. A method for operating a semiconductor memory device, comprising the steps of:
    achieving a delay locked state by correcting a phase difference between a reference clock and an internal delayed clock and indicating a state that a larger delay amount than a maximum delay amount of a delay line is required, or a smaller delay amount than a minimum delay amount of the delay line is required; and resetting wholly or partially a delay locked loop according to the state of the delay line.

9. The method as recited in claim 8, wherein the step of achieving the delay locked state includes the steps of:
generating a control signal which corresponds to phase difference between the reference clock and feedback rising and feedback falling clocks;
determining a delay mode according to the control signal;
generating a delayed rising clock signal and a delayed falling clock signal by delaying the reference clock for a delay amount determined according to the delay mode;
indicating that the delay amount is a maximum or a minimum delay amount of a delay line;
correcting a duty ratio of the delayed rising clock signal and the delayed falling clock signal; and
generating a delay locked signal according to an output signal of a delay line which is not reset when the delay locked loop is partially reset.

10. The method as recited in claim 9, wherein the step of achieving the delay locked state further includes the step of generating the feedback rising clock and the feedback falling clock by delaying the delayed rising clock and the delayed falling clock for a modeled delay amount.

\* \* \* \* \*